(12) United States Patent
Jackson

(10) Patent No.: US 6,954,474 B2
(45) Date of Patent: Oct. 11, 2005

(54) METHOD AND APPARATUS FOR BACKSIDE MONITORING OF VCSELS

(75) Inventor: Andrew W. Jackson, Santa Barbara, CA (US)

(73) Assignee: Optical Communications Products, Inc., Woodland Hills, CA (US)

(*) Notice: Subject to any disclaimer, the term of this patent is extended or adjusted under 35 U.S.C. 154(b) by 76 days.

(21) Appl. No.: 10/607,899

(22) Filed: Jun. 27, 2003

(65) Prior Publication Data

US 2004/0264537 A1 Dec. 30, 2004

(51) Int. Cl.[7] ............................................. H01S 3/13
(52) U.S. Cl. ......................... 372/29.02; 372/29.022
(58) Field of Search ............. 359/154, 24; 372/29.022, 372/43–50, 29.01–29.016; 385/31

(56) References Cited

U.S. PATENT DOCUMENTS 5,663,944 A * 9/1997 Mun ........................... 369/121
5,761,350 A * 6/1998 Koh ............................. 385/14
6,037,644 A * 3/2000 Daghighian et al. ........ 257/444
6,546,029 B2 * 4/2003 Sirbu et al. .................. 372/20

* cited by examiner

Primary Examiner—Mingun Oh Harvey
Assistant Examiner—Tuan N. Nguyen
(74) Attorney, Agent, or Firm—Barlow, Josephs & Holmes, Ltd.

(57) ABSTRACT

A VCSEL (vertical cavity surface emitting laser) is formed on the top surface of the substrate having an opposed bottom surface. In one exemplary embodiment, the opposed bottom surface is polished and coated with an anti-reflective coating. A photodetector is disposed beneath the bottom surface and is capable of detecting light emitted by the VCSEL. In another embodiment, an angle selective filter is disposed between the photodetector and the unpolished and uncoated bottom surface. The apparatus urges light emitted by the VCSEL to be detected by the photodetector and limits light from other sources from reaching the photodetector. A method for monitoring the optical output of a VCSEL includes providing one of the exemplary apparatuses, causing the VCSEL to emit light that is detected by the photodetector, and adjusting the optical output of the VCSEL based on the amount of light detected by the photodetector.

31 Claims, 5 Drawing Sheets

METHOD AND APPARATUS FOR BACKSIDE MONITORING OF VCSELS

FIELD OF THE INVENTION

The present invention generally relates to vertical cavity surface emitting lasers (VCSELs) and more particularly to a method and apparatus for monitoring the optical output of VCSELs, and a method for forming the apparatus.

BACKGROUND OF THE INVENTION

In today's rapidly advancing optoelectronics industry, vertical cavity surface emitting lasers, also known as VCSELs, are preferred as optical sources. A VCSEL is a semiconductor microlaser diode that emits light in a generally cylindrical beam. The beam is emitted vertically from the surface of the substrate on which it is fabricated and a VCSEL offers significant advantages when compared to the edge-emitting lasers currently used in the majority of fiber optic communications devices. Vertical cavity surface emitting lasers are promising emitters for fiber data communication in the speed range of 100 Mbs and 1 Gbs. They enable high performance systems in Gigabit Ethernet, Fiber Channel, and ATM markets, for example.

A VCSEL is an extremely small laser which consists of two mirrors sandwiching an active region. The total thickness of the layers which make up the laser may be on the order of three microns or less. The mirrors reflect the light generated in the active region back and forth. The back and forth reflection results in "stimulated emission" providing emitted light at a single wavelength or color. Such "coherent" emission is the hallmark of lasing.

VCSELs are favored because of the ease of their manufacture, the repeatably of the manufacturing process used to form the VCSELs, the reduced substrate area each VCSEL requires, and the superior uniformity of VCSELs formed within the same substrate. Additionally, VCSELs can be produced in a two-dimensional array configuration on a common substrate and can be tested at the wafer level. Furthermore, the circular and low divergence output beams of VCSELs, eliminate the need for corrective optics and provide a high transmission speed with low power consumption at a relatively low cost. A principal characteristic of a VCSEL is that it emits light beams vertically rather than laterally, i.e., in a direction normal to the P–N junction and the surface of the semiconductor substrate on which the VCSEL is fabricated.

Because of the ease of their manufacture, the superior uniformity of VCSELs formed within the same substrate, and increased demands to integrate multiple data signals into a small area, tightly packed arrays of VCSELs formed within a substrate have become favored in today's optoelectronics industry. Each of the VCSELs in the fixed array may be coupled to an optical transmission medium such as an optical fiber and may each deliver an optical data signal. The optical data signal carries important information and is typically converted back to an electrical signal thereafter. It is useful to monitor and control the optical power of the light emitted by the VCSEL to provide the data signal. When the VCSELs are formed in close proximity in a tightly packed array, it is difficult to individually monitor the optical power of each VCSEL. Monitoring is typically performed by monitoring the primary light beam that is emitted by a VCSEL, after it reflects off another surface. For an array of tightly-packed VCSELs, only one of the VCSELs is typically monitored during operation due to space constraints and also because attempting to monitor each VCSEL using a dedicated monitor photodetector is very expensive.

VCSELs may be fabricated on one surface of a substrate such as a gallium arsenide (GaAs) wafer or another wafer chosen to be transmissive to light emitted by the VCSEL, particularly long wavelength (LW) VCSELs. It is therefore desirable to monitor the VCSEL by monitoring light emitted by the VCSEL, and which travels through the substrate and exits the opposed surface of the substrate. If the opposed surface of the substrate is a rough surface, however, light emitted from the backside of the VCSEL and travelling within the substrate, may continuously scatter in the substrate when it encounters the backside. Furthermore, if the VCSELs are arranged in an array on a common substrate, light emitted from multiple unintended VCSELs may exit the substrate and be sensed by a photodetector intended to monitor a single VCSEL. Light from the various VCSELs may exit at various angles, particularly when the surface is a rough surface. Therefore, there are difficulties associated with monitoring a VCSEL using backside monitoring.

It would therefore be desirable to provide an apparatus to accurately monitor the light of a designated VCSEL formed on the top surface of a substrate, by using a photodetector disposed opposite the bottom surface of the substrate.

SUMMARY OF THE INVENTION

In an exemplary embodiment, the present invention provides an apparatus including a vertical cavity surface emitting laser (VCSEL) formed on a top surface of a substrate. The substrate is transmissive to light emitted by the VCSEL. The VCSEL may be included within an array of VCSELs formed on the top surface of the substrate. The apparatus further includes a photodetector, which is disposed facing an opposed bottom surface of the substrate and is capable of detecting light emitted by the VCSEL. The apparatus further includes an angle selective filter, disposed between the bottom surface of the substrate and a detecting surface of the photodetector, and capable of allowing only light which reaches the angle selective filter within a limited range of angles, to reach the photodetector.

In another exemplary embodiment, the present invention provides an apparatus including a VCSEL formed on a top surface of a substrate. The substrate is transmissive to light emitted by the VCSEL. The apparatus also includes a photodetector, which is disposed facing an opposed bottom surface of the substrate and is capable of detecting light emitted by the VCSEL. The opposed bottom surface is polished to reduce scattering of the light emitted by the VCSEL. The apparatus further includes an anti-reflective coating formed on the polished bottom surface.

In another exemplary embodiment, the present invention provides a method for monitoring the optical power of a VCSEL. The method includes providing a VCSEL on a top surface of a substrate that includes an opposed bottom surface, polishing the bottom surface, and forming an anti-reflective coating on the polished bottom surface. The method further includes positioning a photodetector facing the bottom surface such that the photodetector is capable of detecting light emitted by the VCSEL, and causing the VCSEL to emit light.

In yet another exemplary embodiment, the present invention provides another method of monitoring the optical power of a VCSEL. The method includes providing a VCSEL on a top surface of a substrate that includes an opposed bottom surface, positioning a photodetector facing the bottom surface such that the photodetector is capable of detecting light emitted by the VCSEL, providing an angle selective filter between the bottom surface of the substrate and a detecting surface of the photodetector, and causing the VCSEL to emit light.

BRIEF DESCRIPTION OF THE DRAWINGS

The invention is best understood from the following detailed description when read in conjunction with the accompanying drawings. It is emphasized that, according to common practice, the various features of the drawings are not to scale. On the contrary, the dimensions of the various features are arbitrarily expanded or reduced for clarity. Like numerals denote like features throughout the specification and drawings. Included are the following figures.

DETAILED DESCRIPTION OF THE EMBODIMENTS OF THE INVENTION

The present invention provides an apparatus and a method for monitoring the optical output/power of a laser that emits light from a top surface of a substrate. In one embodiment, the lasers are VCSELs formed on the top surface of a substrate that is chosen in conjunction with the VCSELs, to be transmissive to the wavelength of light emitted by VCSELs. Long wavelength VCSELs and short wavelength VCSELs may be used. The VCSEL may emit light having a wavelength of 850 nm, 1310 nm 1550 nm, or other wavelengths. Various substrates may be used that are transmissive to light of various wavelengths that may be emitted by VCSELs. The VCSEL may emit a primary light beam from the top surface of the substrate that is used for the data signal. A secondary light beam may be emitted opposite the primary light beam and travel through the substrate and encounter the opposed bottom surface. Other light rays emitted by the VCSEL may also propagate within the substrate. When the light within the substrate encounters the bottom surface of the substrate, part of the light is internally reflected, while part of the light exits the substrate if the angle it makes with the surface is less than the critical angle. Each time a ray is internally incident upon a substrate surface, part of the ray may exit the substrate and part of the ray will be internally reflected. The internally reflected light rays may further propagate within the substrate, further internally reflecting off of the substrate surfaces they encounter. When the substrate surface is rough, a significant amount of diffusive scattering occurs, compared to specular reflectance. In essence, in addition to the primary and secondary light beams, some light from each VCSEL typically scatters within the substrate and portions of the light exit the substrate at various locations. This is true for each VCSEL of a fixed array of VCSELs.

A monitor photodetector is used to detect light emitted by a VCSEL. In one embodiment, the photodetector is placed beneath the bottom surface of the transmissive substrate and in fixed position to desirably monitor light produced by a single designated VCSEL.

According to one exemplary embodiment of the present invention, a photodetector is placed directly beneath the VCSEL to be monitored, and an angle selective filter is placed between the substrate and the photodetector to prevent light emitted by VCSELs other than the VCSEL designated to be monitored, to reach the photodetector. According to another embodiment of the present invention, the bottom surface is polished and then treated with an anti-reflective coating to reduce internal scattering and internal reflection of the light so that the secondary light beams emitted by the designated VCSEL pass through the substrate, exit the bottom surface, and reach the corresponding photodetector.

Figure 1:
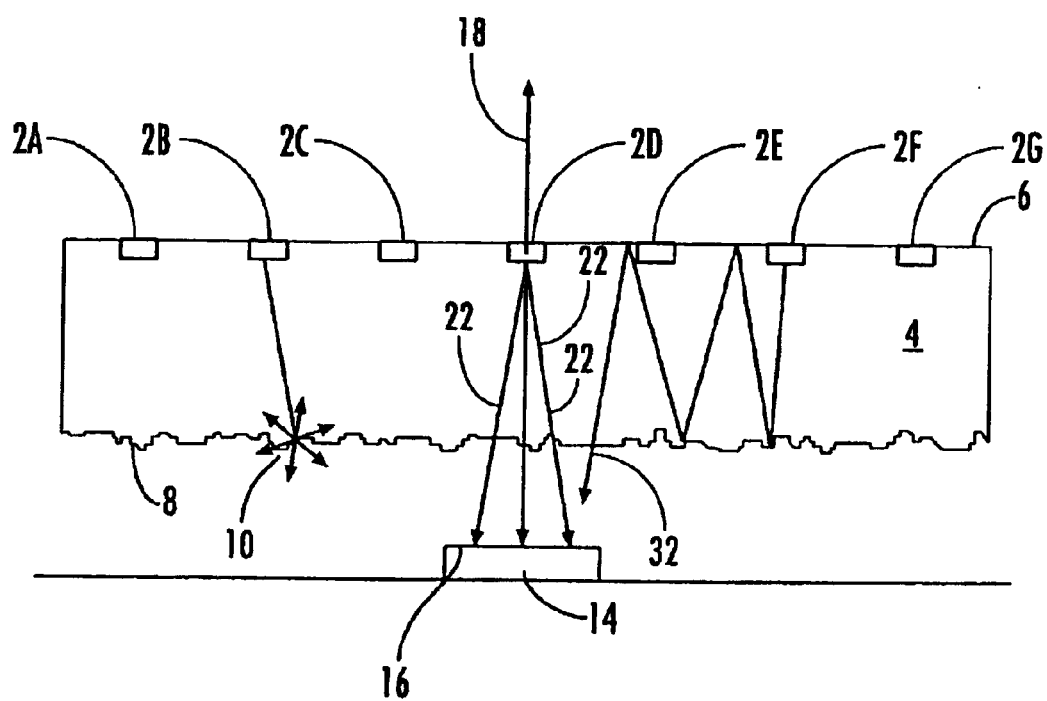
FIG. 1 is a cross-sectional view of an apparatus showing a single monitor photodetector configured to detect light emitted by a designated VCSEL of an array of VCSELs.

FIG. 1 is a side view of an apparatus for monitoring the optical power of a single designated VCSEL using a single photodetector. FIG. 1 illustrates a basic concept of the present invention—backside monitoring. According to the exemplary embodiment shown in FIG. 1, VCSELs 2A–2G are formed on top surface 6 of substrate 4. Substrate 4 also includes opposed bottom surface 8. Substrate 4 may be a semiconductor or other ceramic material such as gallium arsenide (GaAs), silicon (Si), indium phosphide (InP), gallium nitride (GaN), sapphire, glass, or other suitable materials. Other substrate materials may be used in other exemplary embodiments. In one embodiment, substrate 4 may be a GaAs substrate having a thickness of 500 µm. Other thicknesses may be used in other exemplary embodiments. VCSELs 2A–2G may be formed on substrate 4 using various suitable methods. The exemplary arrangement of seven VCSELs 2A–2G formed in a linear array is intended to be exemplary only. According to other exemplary embodiments, various numbers of VCSELs may be formed in variously configured and spaced arrays. According to one exemplary embodiment, the array of VCSELs may include twelve VCSELs in a linear array or in a 6×2 or other array. In yet another embodiment, only one VCSEL is formed on the top surface of the substrate instead of an array of VCSELs.

According to an exemplary embodiment, substrate 4 is chosen to be substantially transparent to the wavelength of light which is emitted by the VCSELs formed on the substrate, such as VCSELs 2A–2G. For example, a gallium arsenide substrate may be used for VCSELs which emit light having a wavelength of 850 nm, and silicon may be used as substrate 4 for VCSELs which are formed to emit light having a wavelength of 1310 nm. Other wavelengths of light and corresponding substrate materials may be used in other exemplary embodiments. VCSEL 2D emits light beam 18 out of top surface 6 of substrate 4 and desirably along direction 20, generally perpendicular to top surface 6. Light beam 18 preferably delivers a data signal and may be considered the primary light beam. When a transparent substrate 4 is used, secondary light beams 22 are also emitted by exemplary VCSEL 2D, travel through substrate 4 and desirably exit substrate 4 through bottom surface 8. Secondary light beams 22 travel generally opposite primary light beam 18, which may include a plurality of rays in a conical shape. Each VCSEL of the array may likewise emit a complementary set of opposed light beams. According to the exemplary arrangement shown in FIG. 1, photodetector 14 is positioned facing opposed bottom surface 8 of substrate 4 and along secondary light beams 22 emitted by VCSEL 2D. In other words, photodetector 14 is aligned directly beneath VCSEL 2D. According to this arrangement, photodetector 14 may advantageously be used to primarily monitor designated VCSEL 2D. This is intended to be exemplary only, and according to other exemplary embodiments, exemplary photodetector 14 may not be disposed directly beneath a designated VCSEL such as exemplary VCSEL 2D. It is a fundamental concept of the present invention that photodetector 14 is advantageously positioned in a fixed location to preferentially monitor the optical output of a single designated VCSEL of the VCSEL array, and is not influenced by other VCSELs of the array. In the illustrated embodiment, then, it is desirable for a significant portion of secondary light beams 22 of VCSEL 2D to reach photodetector 14 and it is likewise desirable to prevent light rays from VCSELs other than VCSEL 2D, such as light ray 32, from reaching photodetector 14 and improperly influencing the monitoring of the optical power of VCSEL 2D. Photodetector 14 is capable of detecting light emitted by the VCSEL and may be any of various suitable and conventionally available photodetectors such as various monitor diodes, p-i-n photodetectors, MSM (metal-semiconductor-metal) photodetectors, or various other photodetectors.

Each VCSEL of the array of VCSELs emits some light which travels within substrate 4. Typically, light is partially reflected and partially transmitted each time it encounters a surface such as bottom surface 8. Each time light emitted by a VCSEL encounters a substrate surface such as bottom surface 8, part of the light may be transmitted out of the substrate if it achieves an angle less than the critical angle, with the surface it encounters. Some of the light will reflect off of bottom surface 8. If bottom surface 8 is not polished and is therefore a rough, irregular surface as shown in the illustrated embodiment, a large amount of scattering 10 occurs at bottom surface 8 because a light beam encounters many microsurfaces when it encounters a rough surface. Scattering 10 is diffusive scattering and includes light scattered internally (reflected) at various angles and light transmitted at various angles. If bottom surface 8 is polished, scattering is reduced as specularity is increased.

Figure 2:
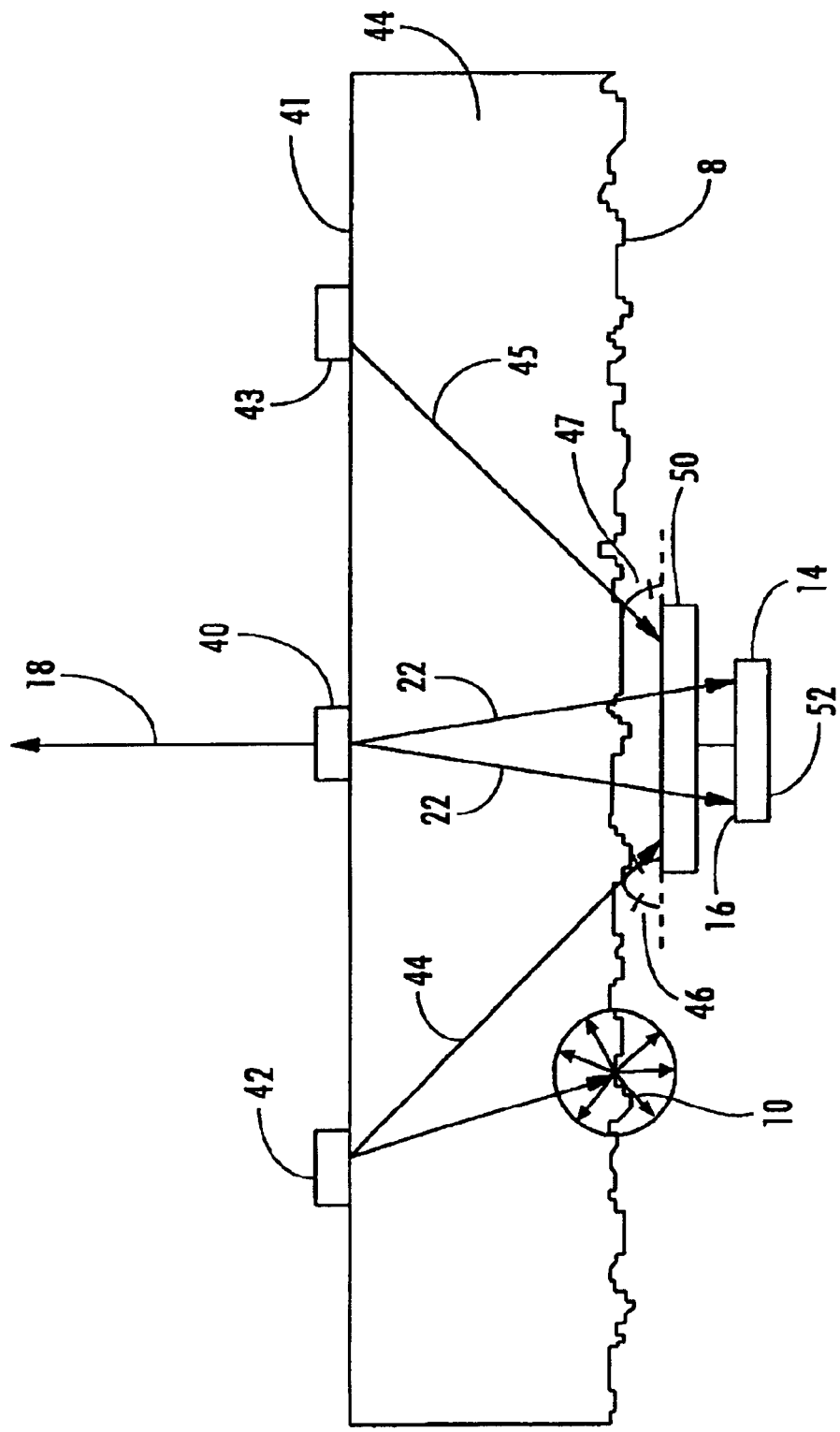
FIG. 2 is a cross-sectional view of an exemplary embodiment of an apparatus of the present invention utilizing an angle selective filter.

FIG. 2 is an exemplary embodiment of the apparatus utilizing an angle selective filter. The apparatus includes VCSEL 40 formed on top surface 6 of substrate 4. Substrate 4 is chosen to be transmissive to light emitted by VCSEL 40. In the illustrated embodiment, VCSEL 40 is included within an array of VCSELs including VCSELs 42 and 43 also formed on top surface 6 of substrate 4. The VCSELs 40, 42 and 43 may each be long wavelength VCSELs. The apparatus further includes photodetector 14, which is disposed facing opposed bottom surface 8 of substrate 4 and in fixed position to monitor the optical power of VCSEL 40. Photodetector 14 is substantially directly beneath VCSEL 40.

The apparatus further includes angle selective filter 50 shown schematically disposed between bottom surface 8 and detecting surface 16 of photodetector 14, and which is capable of allowing only light which reaches angle selective filter 50 within a limited range of angles, to reach photodetector 14. Other light is filtered out. Angle selective filter 50, also known as an angular filter 50, may be formed of a dielectric material and, in one embodiment, may be a multi-layered dielectric material. The dielectric layers of angle selective filter 50 may be formed using conventional film formation techniques, such as evaporation or plasma deposition.

In the illustrated embodiment, angle selective filter 50 is disposed between detecting surface 16 of photodetector 14 and bottom surface 8. In an alternative embodiment (not shown), angle selective filter 50 may be disposed on the bottom surface of the substrate. In yet another embodiment (not shown), angle selective filter 50 is formed on detecting surface 16 of photodetector 14 and may be formed in-situ with photodetector 14. Angle selective filter 50 is used to prevent light such as light rays 44 and 45 from VCSELs 42 and 43 respectively, from reaching photodetector 14. In an exemplary embodiment, angle selective filter 50 may be chosen so that light rays making an angle less than a pre-determined angle, with the angle selective filter, will not be allowed to pass through angle selective filter 50 and reach photodetector 14. In the illustrated embodiment, light rays 44 and 45 make angles 46 and 47, respectively, with substantially planar surface 52 of angular filter 50. If angles 46 or 47 are less than a particular angle, for example 20°, 45° or various other angles, the respective light beam will be filtered by angular filter and not allowed to pass through to photodetector 14. The angle between the light ray and surface 52 of angular filter 50 is an arbitrary manner for illustrating how the angular filter selectively filters out light coming from VCSELs other than the designated VCSEL to be monitored, thereby preventing that light from reaching surface 16 of photodetector 14. In one embodiment, angular filter 50 may prevent light which exits bottom surface 8 of substrate 4 at angles less than 45 degrees, from reaching photodetector 14. The substantially planar configuration of angular filter 50 and the substantially parallel arrangement of angular filter 50, photodetector 14 and substrate 4, is intended to be exemplary only and other arrangements may be used in other exemplary embodiments. In essence, angular filter 50 allows only light which reaches angular filter 50 within a limited range of angles, to reach photodetector 14. Angular filter 50 may be manufactured and positioned to provide the angular selectively desired.

In the illustrated exemplary embodiment, photodetector 14 is mounted directly beneath VCSEL 40. During operation, VCSEL 40 simultaneously emits primary light beam 18 from top surface 6 as the data signal, and secondary light beams 22 that propagate through substrate 4. Secondary light beams 22 are allowed to pass through angular filter 50 and are desirably detected by photodetector 14 when they exit from bottom surface 8.

Figure 3:
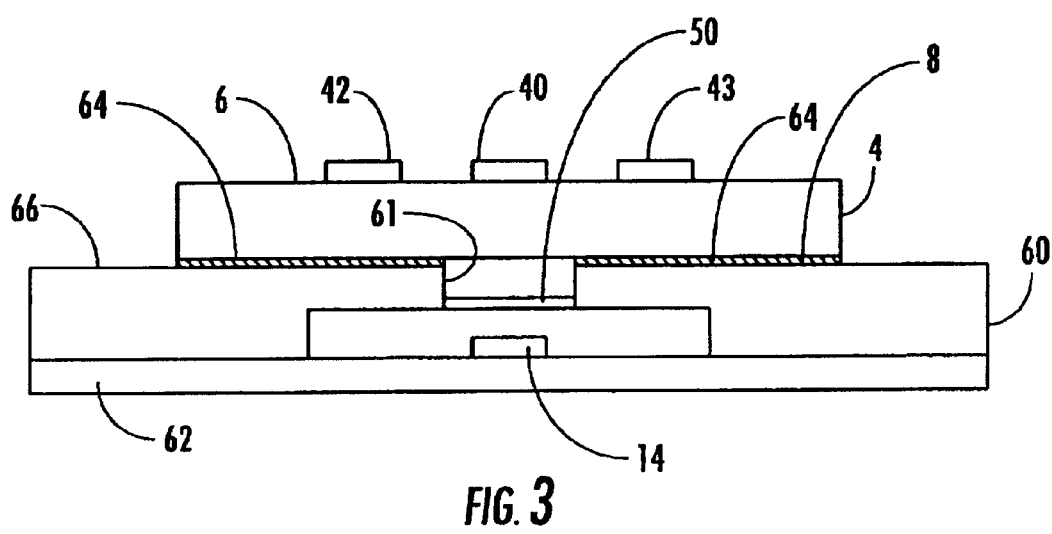
FIG. 3 is a side view of yet another exemplary embodiment in which the angle selective filter is mounted on another member.

FIG. 3 is yet another embodiment of the apparatus wherein angle selective filter 50 is mounted on further member 60. Angle selective filter 50 is disposed between bottom surface 8 of substrate 4 and photodetector 14. In one embodiment, further member 60 may be formed of metal and include hole 61 aligned over photodetector 14 and for retaining angle selective filter 50 therein. Angle selective filter 50 may be mounted on a mechanical stop (not shown) of further member 60, such that light which passes through angle selective filter 50, reaches photodetector 14. In one embodiment, photodetector 14 is mounted over another substrate 62, as shown in FIG. 3. Epoxy layer 64 may be used to join bottom surface 8 to top 66 of further member 60, and is capable of absorbing light that exits from bottom surface 8. This arrangement assists in insuring that only light emitted by VCSEL 40, reaches photodetector 14. In an exemplary embodiment, the epoxy may be a metallic epoxy. In another exemplary embodiment, further member 60 may be formed of quartz or glass or other material that is transmissive to the light emitted by the VCSEL of interest. According to this exemplary embodiment, angle selective filter 50 may be formed on a surface of further member 60, which is disposed between substrate 4 and photodetector 14. In this manner, light within the limited range of angles, may pass through both angle selective filter 50 and transmissive further member 60 and reach photodetector 14.

Figure 4:
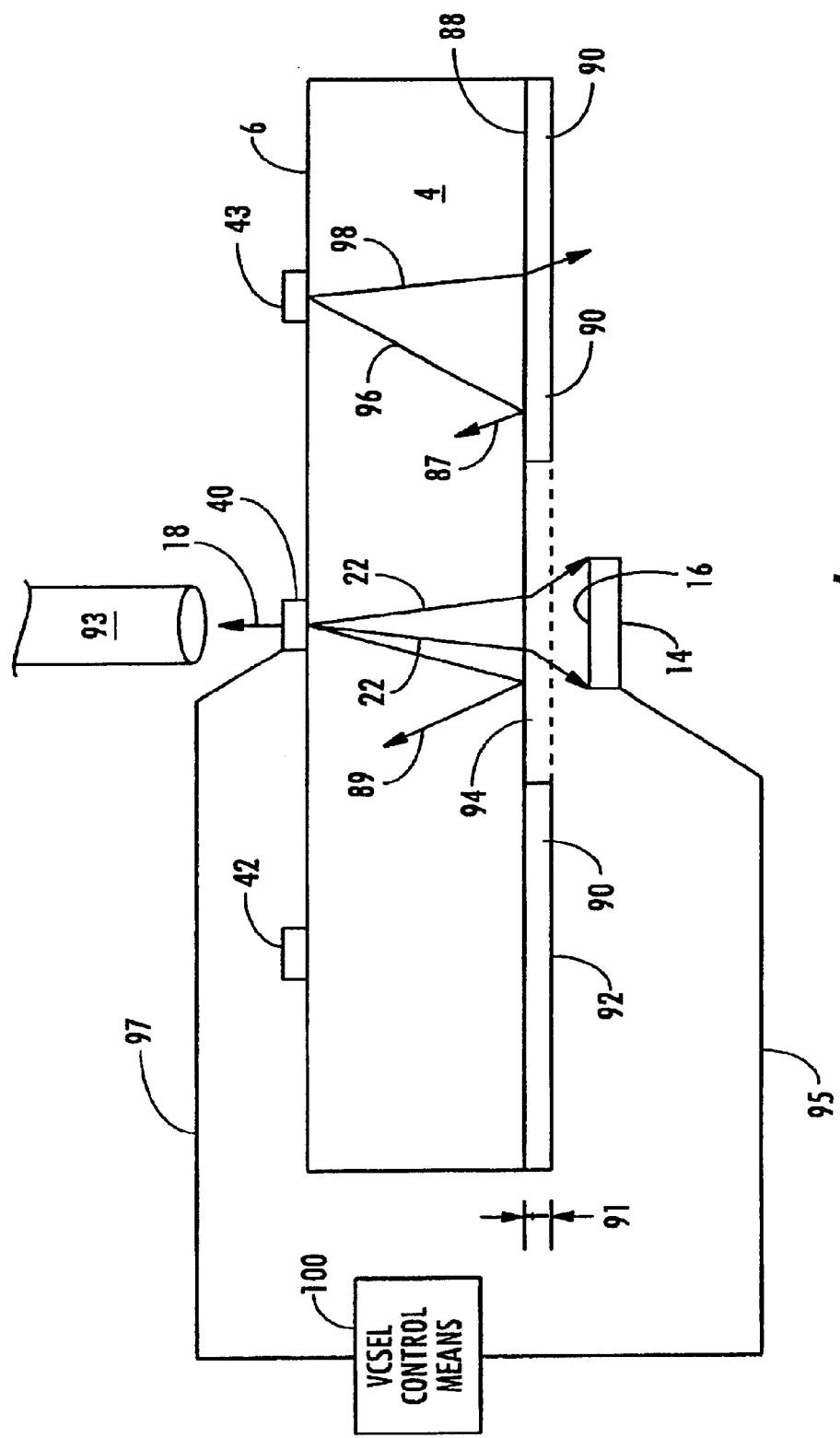
FIG. 4 is a cross-sectional view of an exemplary embodiment of a VCSEL formed on a substrate having a polished bottom surface coated with an anti-reflective coating.

According to another exemplary embodiment, the present invention provides for accurately monitoring the optical output of a designated VCSEL using a single photodetector and by polishing the bottom surface of the substrate then forming an anti-reflective coating on at least portions of the polished bottom surface. FIG. 4 shows VCSELs 40, 42 and 43 formed on top surface 6 of substrate 4. VCSEL 40 is the VCSEL designated to be monitored by photodetector 14 which includes detecting surface 16. According to this exemplary embodiment, the originally, generally rough bottom surface 8 such as shown in FIGS. 1 and 2, has been polished to form smooth bottom surface 88. Various suitable polishing and/or lapping techniques can be used to polish the bottom surface. The polished bottom surface 88 is highly specular and reduces internal diffusive scattering within substrate 4. According to one exemplary embodiment, polished bottom surface 88 may be polished such that internal diffuse reflection is less than $1/100$ of specular reflection for polished bottom surface 88. Furthermore, polished bottom surface 88 may limit the light which exits substrate 4 because internal light may only escape if it makes an angle less than the critical angle with the smooth polished surface, for example, a 16.5° angle for a gallium arsenide surface. While beam 96 is reflected as reflected beam 87, beam 98 exits polished surface 88. Since the polished surface increases specular reflectance, more light may be reflected off of polished bottom surface 88 and undesirably interfere with the VCSELs and the light they emit from top surface 6. As such, after the bottom surface is polished to form polished bottom surface 88 to reduce internal scattering of light, an anti-reflective coating (arc) may optionally be applied.

Anti-reflective substrate coatings significantly reduce surface reflectance and allow greater light transmission. As will be discussed below, anti-reflective coatings reduce reflectance through the process of "optical interference" which counteracts reflected lightwaves. As a result, reflected light is reduced while the proportion of transmitted light is increased. Anti-reflective coatings are used to prevent internal reflection, i.e. to prevent internal light beams 87 and 89 from forming by reflection off of polished bottom surface 88. Internal reflected light beams 87 and 89 are reflected towards top surface 6 of substrate 4 where the beams may undesirably interfere with VCSELs 42, 40, and 43.

Methods for polishing substrates and applying anti-reflective coatings on is semiconductor substrates are disclosed in U.S. Pat. Nos. 6,246,098 B1, 5,894,366, and 6,180,510 B1, the contents of each of which are hereby incorporated by reference.

Anti-reflective coating 90 may be formed using suitable conventional processes such as evaporation, electron beam deposition, sputtering and/or other vacuum deposition procedures. In an exemplary embodiment, anti-reflective coating 90 includes a substantially uniform thickness, t (91). Once formed on polished bottom surface 88, anti-reflective coating 90 prevents internal reflection and advantageously allows light which reaches polished bottom surface 88, to be transmitted out of substrate 4 if at the correct angle. Therefore, in combination with polished bottom surface 88 which reduces internal diffuse scattering, anti-reflective coating 90 advantageously allows light which reaches polished bottom surface 88 to be transmitted out of substrate 4. Anti-reflective coating 90 may be formed of suitable conventional materials including, but not limited to titanium oxide, tungsten oxide, silicon monoxide, silicon dioxide and magnesium fluoride. Anti-reflective coatings are part of a larger family of "thin film" coatings applied to substrates or other transparent media.

According to U.S. Pat. No. 6,246,098 B1, whenever light is incident on the boundary between two media, for example air and silicon, some of the light is reflected at the surface of the silicon and some of the light is transmitted if at an angle less than the critical angle. Reflection at the boundary occurs due to a mismatch of the indices of refraction between the silicon and air. When a beam of light is incident normal to a plane surface, the ratio of the percent light reflected and percent light transmitted is determined by the refractive indexes of the two different media. The intensity of the reflected light beam is given by the following relationship:

$$R=[(N_2-N_1)(N_2+N_1)]^2 \quad \text{(Equation 1)}$$

where R represents the intensity of the reflected light beam relative to the incident light beam, $N_1$ is the index of refraction of a first media and $N_2$ is the index of is refraction of a second media. At the boundary of a air-silicon interface, $N_1$ is the refraction index of air and $N_2$ is the refraction index of silicon. From Equation 1, it can be seen that the amount of light that is reflected at the boundary is therefore larger when the disparity between the two indices of refraction is greater.

The anti-reflective coating and method used to form the anti-reflective coating 90 should be chosen such that the process does not affect the performance of the VCSELs. The refractive index and thickness of anti-reflective coating 90 are selected such that reflections from the outer surface 92 of anti-reflective coating 90 and polished bottom surface 88 of substrate 4 cancel each other out by a phenomenon known as "destructive interference." For the beams to be equal in intensity using a single layer anti-reflective coating, it is necessary that the refractive index ratio be the same at both the interfaces. That is, $$\frac{N_{air}}{N_{film}} = \frac{N_{film}}{N_{substrate}} \quad \text{(Equation 2)}$$

where N represents the refractive indexes of the respective media. The index of refraction of the arc is chosen to be between that of air and substrate 4. Since the refractive index of air is 1.0, the single layer anti-reflective coating ideally should have a refraction index that is equal to the square-root of the refractive index of the semiconductor substrate material. When the refractive indices of the media are perfectly matched in accordance with Equation 2 and the thickness of the single layer coating is made to provide a phase shift of 180 degrees (i.e., destructive interference), the amount of energy reflected at the air-substrate interface should be zero. In order to achieve destructive interference, the thickness, t, of a single layer, anti-reflective coating 90 may be determined by the equation:

$$t=\lambda/4N_{film} \quad \text{(Equation 3)}$$

wherein $\lambda$ is the wavelength of light passing through polished bottom surface 88 of substrate 4, and $N_{film}$ is the refractive index of the anti-reflective coating material. An anti-reflective coating having a thickness, t, ensures that the two reflected waves are 180 degrees out of phase, a requirement that is needed to insure destructive interference.

Still referring to FIG. 4, photodetector 14 is disposed substantially directly beneath VCSEL 40 which is designated to be monitored. Secondary light beams 22 are advantageously detected by detecting surface 16 of photodetector 14. When secondary light beams 22 encounter bottom surface 88, they may be refracted as shown. In the exemplary embodiment illustrated in FIG. 4, anti-reflective coating 90 is selectively disposed on portions of substrate 4 and absent from others such as region 94 (indicated by the dashed line) directly between designated VCSEL 40, and photodetector 14. Conventional methods such as etching may be used to remove portions of an anti-reflective coating from portions of the surface on which it was originally formed, to produce the pattern such as shown in FIG. 4. According to another exemplary embodiment, anti-reflective coating 90 may remain throughout the entire substrate region such as within region 94. According to this exemplary embodiment, an anti-reflective coating is formed between VCSEL 40, designated to be monitored, and photodetector 14.

According to yet another exemplary embodiment, the angular selective filter described in connection with the previous embodiments, may be used in conjunction with the various polished bottom surface/anti-reflective coating embodiments described in conjunction with the illustration of FIG. 4.

FIG. 4 also illustrates another feature that is applicable to each of the exemplary embodiments of the present invention. Although described in conjunction with the polishing/arc embodiments illustrated in FIG. 4, the monitoring/feedback/control feature described below, is equally applicable to other exemplary embodiments such as the angular filter embodiment. VCSEL control means 100 may receive an electrical input signal 95 from photodetector 14 and provide an electrical output signal 97 to VCSEL 40, to control the optical power of VCSEL 40 based on the monitored optical power. VCSEL 40 may be the data laser that produces primary beam 18 which provides the data signal to an optical transmission medium, such as exemplary optical fiber 93. VCSEL 40 may be included within an array of VCSELs 40, 42 and 43 or any of various other array configurations in which each of the VCSELs produce data signals, and may be adjusted by VCSEL control means 100.

When VCSEL 40 sends a data signal, photodetector 14 detects the amount of light, e.g. the optical power, provided by VCSEL 40. When VCSEL 40 emits primary beam 18 to provide the data signal, photodetector 14 monitors the corresponding secondary light beams 22 emitted. A correlation between optical power of primary beam 18 and secondary light beams 22 may be established, for example, by prior measurement. If the optical power provided by VCSEL 40 is less than or greater than the desired optical power, VCSEL control means 100 may be used to adjust the optical power of VCSEL 40. VCSEL control means 100 may include circuitry which compares the detected optical power to desired levels of optical power at various temperatures. The desired level of optical power may be determined by a comparison to an initial optical power output of the VCSEL or other pre-determined values may be used. VCSEL control means 100 may include a computer and various electronic circuits. If the monitored optical power, as indicated by electrical input signal 95, requires adjustment, VCSEL control means 100 sends out electrical output signal 97 to adjust VCSEL 40. This may include varying the optical power of the designated VCSEL to maintain the optical power of the data signal at desired levels. Conventional means and circuitry (not shown) may be used to drive the VCSEL or array of VCSELs. In this embodiment, electrical output signal 97 may be provided to the VCSEL driver (not shown) to adjust the VCSEL or VCSELs. This monitoring procedure may take place after various system calibrations have been performed at various temperatures. VCSEL control means 100 may optionally include a temperature signal to compare to a temperature-optical power correlation. In this manner, the variation of the VCSELs over temperature can be determined and VCSEL optical output can be adjusted across a wide range of temperatures.

In another exemplary embodiment, VCSELs 42 and 43 may similarly be data lasers but, because of the superior uniformity of VCSELs formed on a common substrate, in particular VCSELs in close proximity on a common substrate, one monitor photodetector 14 may be used to monitor the optical power of only single designated VCSEL 40. VCSEL control means 100 may then provide an electrical output signal 97 to adjust multiple VCSELs such as VCSELs 42 and 43. Electrical output signal 97 may, for example, be provided to a laser driver (not shown) to adjust the optical power of multiple VCSELs based on the accurately monitored optical output of one designated VCSEL.

Figure 5:
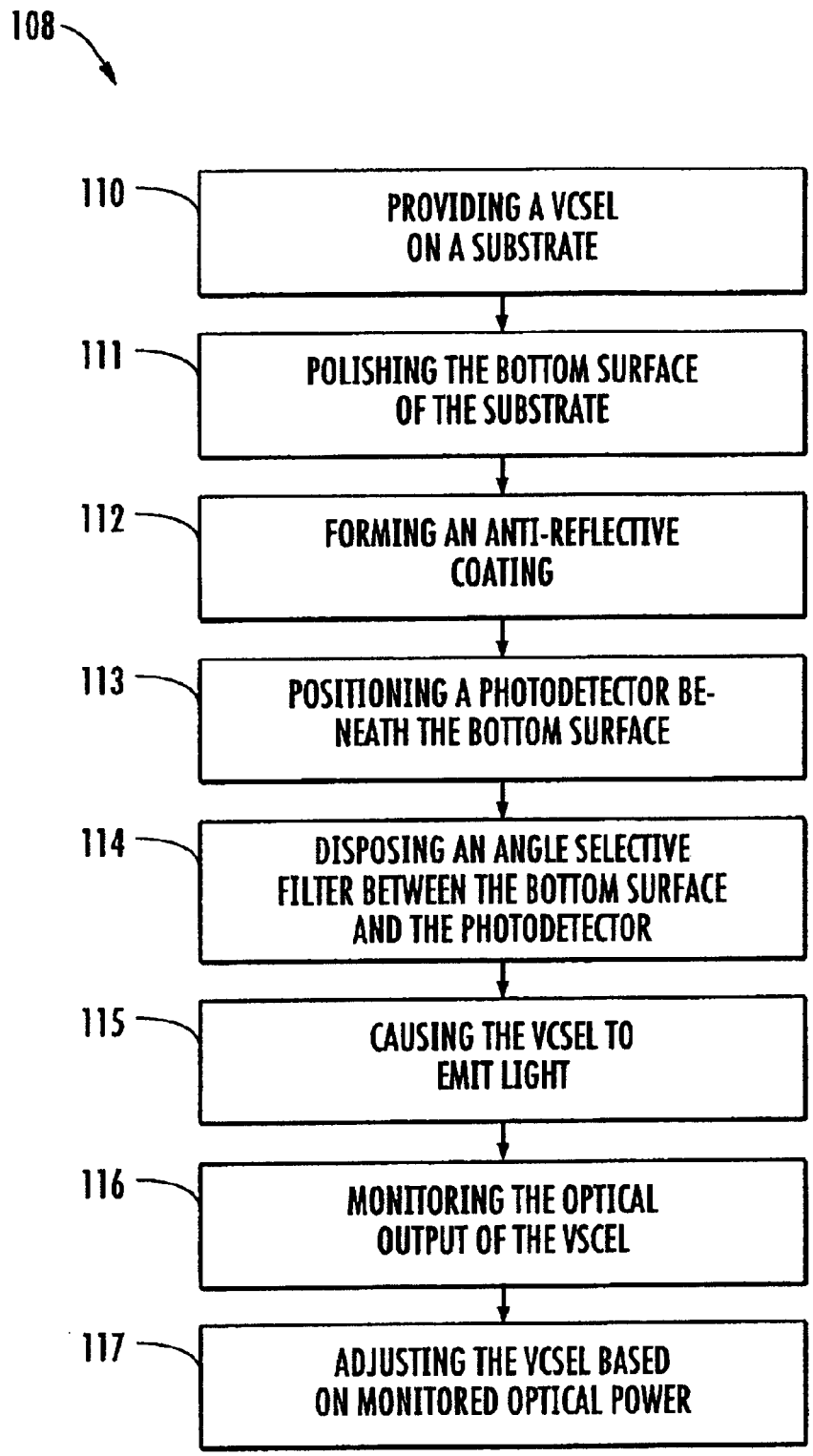
FIG. 5 is a flow chart showing an exemplary sequence of operations for monitoring the optical power of a VCSEL.

FIG. 5 is a schematic flow diagram showing the method 108 for monitoring the optical power of a VCSEL according to the present invention. FIG. 5 shows process operations 110–117. According to one of the embodiments described hereinabove, optional step 114 may not be used. According to another exemplary embodiment described hereinabove, optional process steps 111 and 112 may not be used. According to still a further embodiment, each of optional steps 111, 112 and 114 may be used.

Method 108 includes providing a designated VCSEL on a substrate (110), polishing the opposed bottom surface of the substrate (111), and forming an anti-reflective coating on the polished bottom surface of the substrate (112). The substrate utilized is substantially transmissive to light emitted by the VCSELs. Method 108 further includes positioning a photodetector facing the bottom surface in a fixed position with respect to the VCSEL (113) such that the photodetector is capable of detecting light emitted by the VCSEL. The VCSEL is then caused to emit light (115). In one embodiment, where the VCSEL is a first VCSEL within an array of VCSELs, step 115 may include causing each of the VCSELs to individually emit light.

The method then provides for monitoring the optical power of the designated VCSEL (116), then adjusting the VCSEL based on the monitored optical power (117) if necessary. In an exemplary embodiment, step 117 may include adjusting the optical power of multiple VCSELs within a VCSEL array based on the monitored optical power of the designated VCSEL.

Method 108 then illustrates three exemplary embodiments of the present invention. According to one exemplary embodiment in which optional step 114 is not used, a polished surface coated with anti-reflective coating is provided to assist in the accurate monitoring of the VCSEL of interest. According to a second exemplary embodiment in which optional steps 111 and 112 are not used, an angle selective filter is used to aid in accurately monitoring the optical output of a VCSEL. According to a third exemplary embodiment, each of the aforementioned techniques are used together.

The preceding merely illustrates the principles of the invention. It will thus be appreciated that those skilled in the art will be able to devise various arrangements which, although not explicitly described or shown herein, embody the principles of the invention and are included within its scope and spirit. Furthermore, all examples and conditional language recited herein are principally intended expressly to be only for pedagogical purposes and to aid in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and the functional equivalents thereof. Additionally, it is intended that such equivalents include both currently known equivalents and equivalents developed in the future, i.e., any elements developed that perform the same function, regardless of structure. The scope of the present invention, therefore, is not intended to be limited to the exemplary embodiments shown and described herein. Rather, the scope and spirit of the present invention is embodied by the appended claims.

What is claimed is:

1. An apparatus comprising:
   a VCSEL (vertical cavity surface emitting laser) formed on a top surface of a substrate that is transmissive to light emitted by the VCSEL;
   a photodetector disposed facing an opposed bottom surface of the substrate and capable of detecting light emitted by the VCSEL; and
   an angular filter disposed between the bottom surface and a detecting surface of the photodetector,
   said angular filter being capable of allowing only light which reaches the angular filter within a limited range of angles to reach the photodetector,
   said angular filter being mounted one of on and within a further member disposed between the bottom surface of the substrate and the photodetector.

2. The apparatus as in claim 1, wherein the photodetector is disposed directly beneath the VCSEL.

3. The apparatus as in claim 1, wherein the bottom surface is polished to reduce scattering of the light emitted by the VCSEL, within the substrate.

4. The apparatus as in claim 3, wherein an anti-reflective coating is formed on the polished bottom surface.

5. The apparatus as in claim 1, wherein the angular filter is formed of a multi-layered dielectric material.

6. The apparatus as in claim 1, wherein the angular filter is disposed one of on the bottom surface of the substrate and on the detecting surface of the photodetector.

7. The apparatus as in claim 1, wherein the VCSEL is coupled to an optical transmission medium to deliver an optical data signal.

8. The apparatus as in claim 1, wherein the VCSEL is included within an array of VCSELs formed on the top surface.

9. The apparatus as in claim 8, in which the angular filter prevents light emitted by other VCSELs of the array of VCSELs, from reaching the detecting surface of the photodetector.

10. The apparatus as in claim 8, further comprising adjusting means for adjusting optical output of a plurality of VCSELs of the array of VCSELs based on light detected by the photodetector.

11. The apparatus as in claim 1, in which the VCSEL is capable of emitting a primary light beam from the top surface and a secondary light beam through the substrate and exiting from the bottom surface, the photodetector capable of sensing the secondary light beam.

12. The apparatus as in claim 1, wherein the substrate comprises one of silicon and gallium arsenide.

13. The apparatus as in claim 1, in which the angular filter prevents light which exits the bottom surface of the substrate at angles less than 45 degrees, from reaching the photodetector.

14. The apparatus as in claim 1, in which the angular filter includes a filter surface and wherein the limited range of angles comprise angles greater than 45 degrees with the filter surface.

15. The apparatus as in claim 1, further comprising adjusting means for adjusting optical output of the VCSEL based on light detected by the photodetector.

16. An apparatus comprising:
    a VCSEL (vertical cavity surface emitting laser) formed on a top surface of a substrate that is transmissive to light emitted by the VCSEL;
    a photodetector disposed facing an opposed bottom surface of the substrate and capable of detecting light emitted by the VCSEL; and
    filter means disposed between the bottom surface and a detecting surface of the photodetector for allowing only light within a limited range of angles to reach the photodetector.

17. The apparatus as in claim 16 wherein said filter means comprises:
    an angular filter disposed between the bottom surface and a detecting surface of the photodetector,
    said angular filter being configured and arranged to allow only light which reaches the angular filter within a limited range of angles to reach the photodetector.

18. The apparatus as in claim 17 wherein said photodetector is disposed directly beneath the VCSEL.

19. The apparatus as in claim 17 wherein the VCSEL is included within an array of VCSELs formed on the top surface.

20. The apparatus as in claim 19, in which the angular filter prevents light emitted by other VCSELs of the array of VCSELs, from reaching the detecting surface of the photodetector.

21. The apparatus as in claim 19, further comprising adjusting means for adjusting optical output of a plurality of VCSELs of the array of VCSELs based on light detected by the photodetector.

22. The apparatus as in claim 16 wherein said filter means comprises:
    an anti-reflective coating formed on the bottom surface of said substrate, said bottom surface being polished to reduce scattering of light emitted by the VCSEL.

23. The apparatus as in claim 22, wherein the photodetector is disposed directly beneath the VCSEL.

24. The apparatus as in claim 22, wherein the bottom surface is polished such that internal diffuse reflection is less than 1/100 of specular reflection.

25. The apparatus as in claim 22, wherein the anti-reflective coating is selected from the group consisting of titanium oxide, tungsten oxide, silicon monoxide, silicon dioxide and magnesium fluoride.

26. The apparatus as in claim 22, wherein the anti-reflective coating has a refractive index that is approximately the square-root of the refractive index of the substrate.

27. The apparatus as in claim 22, wherein the VCSEL is included within an array of VCSELs formed on the top surface.

28. The apparatus as in claim 22, in which the VCSEL is capable of emitting a primary light beam from the top surface and a secondary light beam through the substrate and exiting from the bottom surface, the photodetector capable of sensing the secondary light beam.

29. The apparatus as in claim 22, wherein the substrate comprises one of silicon and gallium arsenide.

30. The apparatus as in claim 22, further comprising an angular filter disposed between the bottom surface and a detecting surface of the photodetector and capable of allowing only light which reaches the angular filter within a limited range of angles to reach the photodetector.

31. The apparatus as in claim 22, further comprising adjusting means for adjusting optical output of the VCSEL based on light detected by the photodetector.

* * * * *